United States Patent [19]

Comstedt

[11] 4,117,408
[45] Sep. 26, 1978

[54] APPARATUS FOR INDICATING THE LOADING OF AN ELECTRIC AC MOTOR

[75] Inventor: Anders Per Philip Comstedt, Lund, Sweden

[73] Assignee: AB Scaniainventor, Helsingborg, Sweden

[21] Appl. No.: 794,688

[22] Filed: May 6, 1977

[51] Int. Cl.² .......................... H03D 3/02; H02P 5/00
[52] U.S. Cl. .................................. 328/133; 328/187; 318/227
[58] Field of Search ............................. 328/133, 187; 307/233 A, 233 B, 233 R; 318/227

[56] References Cited

U.S. PATENT DOCUMENTS

| | | | |
|---|---|---|---|
| 3,465,256 | 9/1969 | Moses | 328/133 |
| 3,588,710 | 6/1971 | Masters | 328/133 |
| 3,619,750 | 11/1971 | Mokrytzki et al. | 318/227 X |
| 3,753,063 | 8/1973 | Graf | 318/227 |
| 3,872,388 | 3/1975 | James | 328/133 |
| 4,041,361 | 8/1977 | Cornell | 318/227 |

*Primary Examiner*—John S. Heyman
*Attorney, Agent, or Firm*—Karl W. Flocks

[57] ABSTRACT

An apparatus for providing a signal the magnitude of which indicates the loading of an AC motor. Two pairs of antiparallel-connected diodes generate two AC signals of constant amplitude and of fixed phase position relative to the motor current and the motor voltage, respectively. A load indicating signal is obtained by means of a phase comparator to which these two signals are supplied. A rectifier circuit produces a direct voltage proportional to the supply voltage of the motor, and the direct voltage is combined with the output signal of the phase comparator to compensate for variations in the output signal, which depend upon variations of the supply voltage.

1 Claim, 11 Drawing Figures

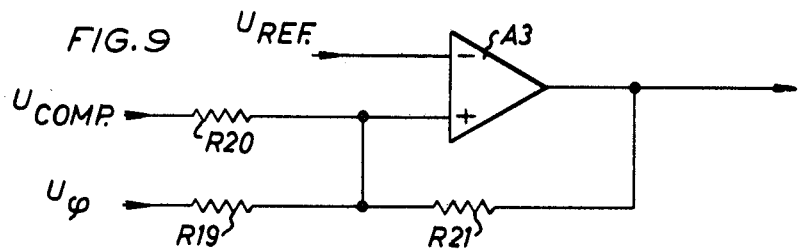
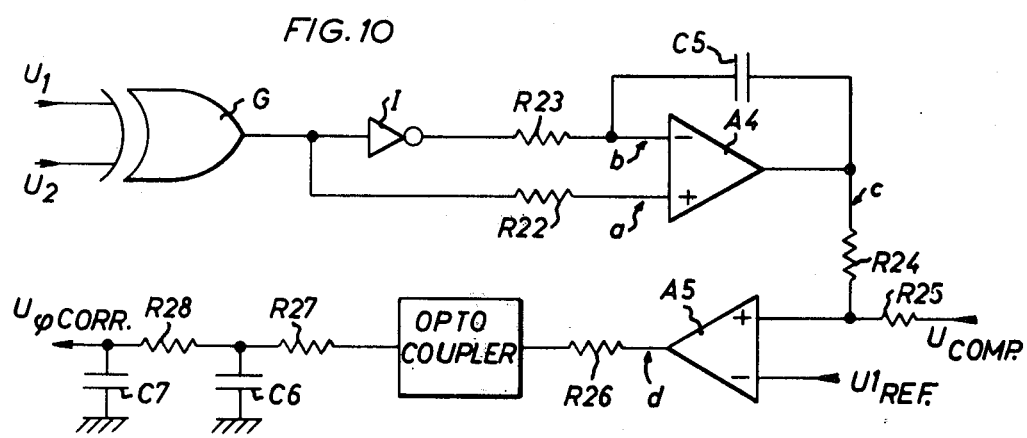
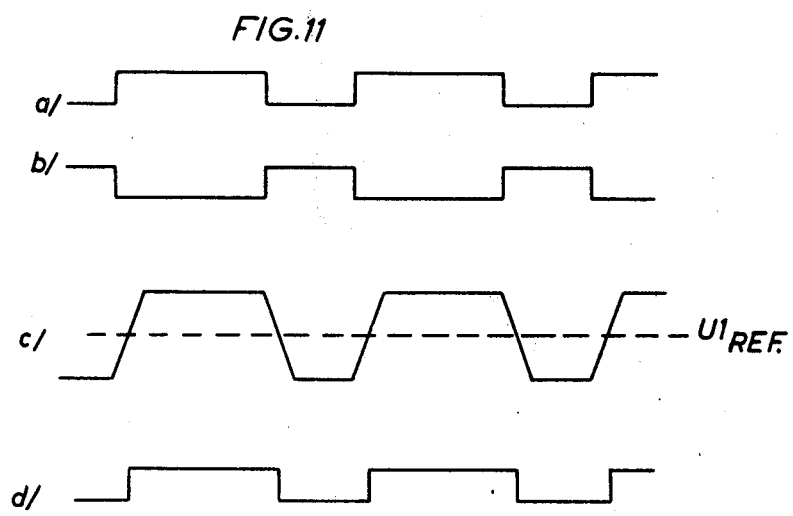

APPARATUS FOR INDICATING THE LOADING OF AN ELECTRIC AC MOTOR

BACKGROUND OF THE INVENTION

1. Field of the Invention

This invention relates to an apparatus for indicating the loading of an electric AC motor, and more particularly to such an apparatus for asynchronous motors.

There are a great many domains where a simple apparatus for indicating the loading of AC motors and variations in said loading would be extremely valuable and could facilitate and improve the control of various processes or operations dependent upon the working conditions of the motor. Mention may be made for instance of supervision to avoid idling or overloading, indication of the completion of a work cycle such as in drilling, thread cutting and sawing operations, possibly combined with the release of another work cycle, and control of the power of a load in dependence of the loading of an electric AC motor.

2. Description of the Prior Art

For indication of the loading of an AC motor use has earlier been made of devices indicating the motor current or the motor power, but these devices suffer from disadvantages among other things as a consequence of poor sensibility to load variations within parts of the load range. An indication of the loading of an AC motor can also be realized by means of a device for generating a signal the magnitude of which is a function of the phase difference between the motor current and the motor voltage, since said phase difference is substantially linearly related to the loading. One disadvantage from which such a phase difference detecting device suffers, is in some cases its sensitivity to variations in the supply voltage of the motor.

SUMMARY

One object of the present invention therefore is to provide an apparatus for indicating the loading of an AC motor while utilizing the phase difference between the motor current and the motor voltage, and particularly to provide such an apparatus the load indication of which is independent of variations of the supply voltage.

These objects are attained according to the present invention in that the apparatus comprises circuit means for generating a first alternating voltage signal of fixed phase position relative to the motor current and a second alternating voltage signal of fixed phase position relative to the motor voltage, phase detector means connected to said circuit means for producing a train of pulses of a width proportional to the phase difference between the first and second alternating voltage signals, rectifier means for producing a direct voltage signal of a magnitude proportional to the amplitude of the motor voltage, and means connected to the phase detector means and the rectifier means for producing the load indicating signal.

As a result, the load indicating signal can be made independent of variations in the supply voltage.

BRIEF DESCRIPTION OF THE DRAWINGS

The invention will now be more fully described in the following with reference to the accompanying drawings:

FIG. 9 is a circuit diagram of an embodiment of the combination circuit according to the present invention;

FIG. 10 is a circuit diagram of an alternative embodiment of the combination circuit according to the present invention; and FIG. 11 illustrates wave forms of signals appearing in the circuit according to FIG. 10.

DESCRIPTION OF THE PREFERRED EMBODIMENTS

Figure 1:
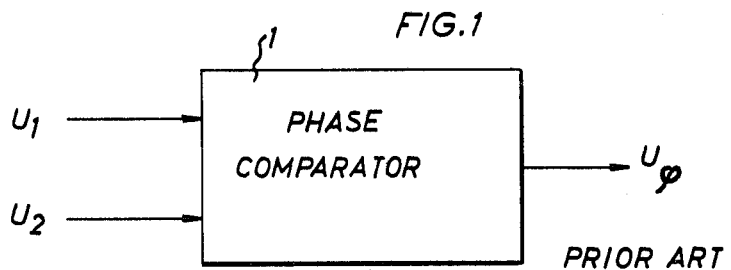
FIG. 1 is a block diagram of a prior art load indicating apparatus based upon the phase difference between current and voltage.

FIG. 1 to which reference is now made illustrates a phase comparator 1 having two inputs one of which receives an alternating voltage $U_1$ which has a fixed phase relative to the AC current of a load (not shown), while the other receives an alternating voltage $U_2$ which has a fixed phase relative to an alternating voltage impressed upon said load. The phase comparator 1 generates at its output a direct voltage $U_\phi$, whose magnitude is proportional to the phase difference $\phi$ between the voltages $U_1$ and $U_2$.

Figure 2:
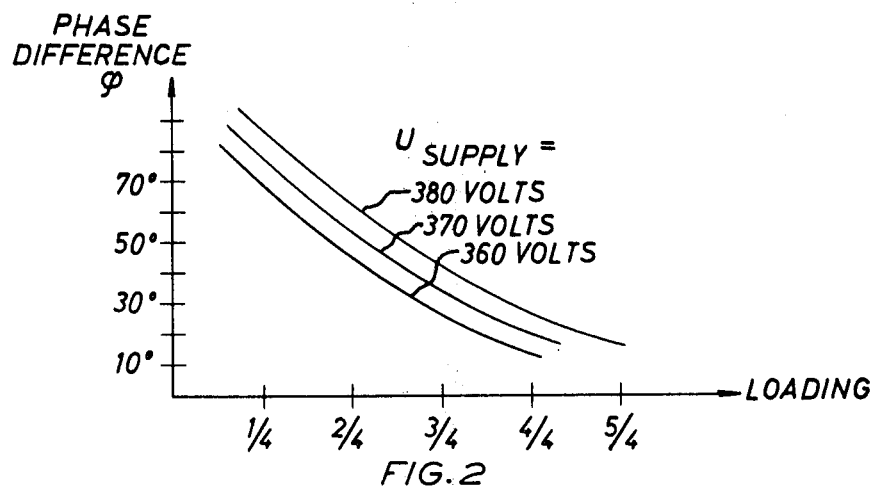
FIG. 2 is a diagram showing the phase difference between the motor current and the motor voltage of an asynchronous motor as a function of the loading and with the supply voltage as a parameter.

If the load for instance is an AC motor, particularly an asynchronous motor, the output signal $U_\phi$ of the phase comparator is useful for indicating the loading of the motor. The apparatus illustrated in FIG. 1 can thus be exploited as a load indicator. This also appears from the diagrams in FIGS. 2 and 3. FIG. 2 shows that the phase difference $\phi$ varies substantially linearly throughout the entire load range up to over full load, and FIG. 3 shows that the output voltage $U_\phi$ of the phase comparator 1 is a substantially linear function of the loading across the same range.

Figure 3:
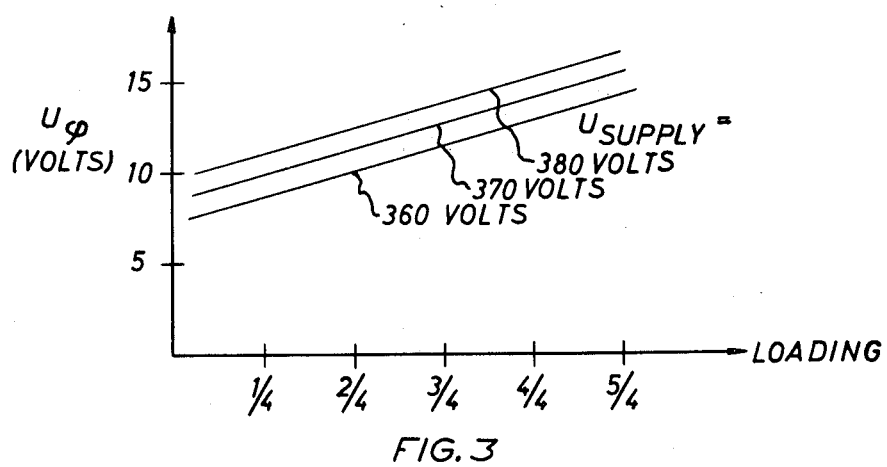
FIG. 3 is a diagram showing the output signal of the load indicating apparatus in FIG. 1 as a function of the loading of the asynchronous motor and with the supply voltage as a parameter.

However, FIGS. 2 and 3 also show a disadvantage of the circuit illustrated in FIG. 1, namely that the phase difference $\phi$ and thus the output voltage $U_\phi$ of the phase comparator 1 is dependent upon the supply voltage impressed upon the load. Provided the loading is constant, $\phi$ will more exactly increase with increasing supply voltage while $U_\phi$ decreases.

In order that the voltage $U_\phi$ delivered by the phase comparator 1 shall be a correct measure of the loading the supply voltage must thus be constant, which of course is not the case in practice.

Figure 4:
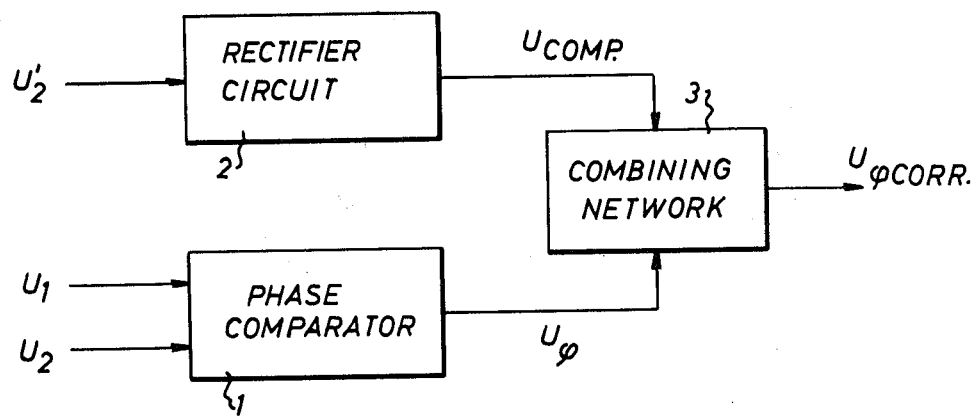
FIG. 4 is a block diagram of a voltage compensated load indicating apparatus according to the present invention.

The circuit according to the present invention illustrated in FIG. 4 will provide compensation for variations of the supply voltage. More exactly, a rectifier circuit 2 is supplied with a voltage proportional to the supply voltage and generates a compensating voltage $U_{comp}$ of a magnitude proportional to the amplitude of the supply voltage. Said direct voltage $U_{comp}$ is combined in a suitable manner with the output voltage $U_\phi$ of the phase comparator 1 in a combination circuit 3, for instance an adding circuit, for obtaining a corrected output voltage $U_{\phi corr}$.

Figure 5:
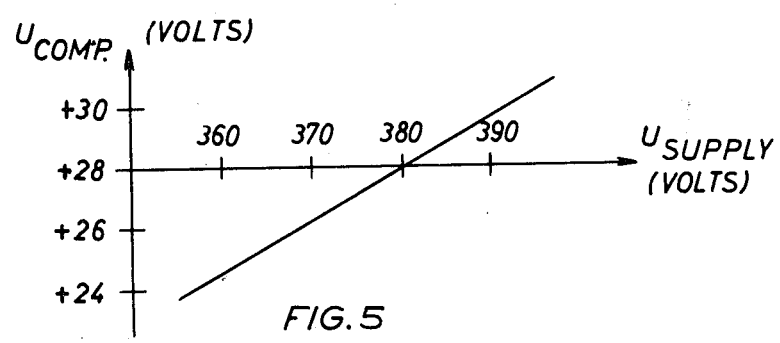
FIG. 5 is a diagram showing the output signal of the voltage compensating circuit as a function of the supply voltage.

FIG. 5 shows the compensating direct voltage $U_{comp}$ as a function of the supply voltage $U_{supply}$. It will be realized that it is possible by suitable dimensioning of the circuits 1, 2 and 3 in FIG. 4 to correct a change of the magnitude of the voltage $U_\phi$ because of a supply voltage variation by means of an ensuing change of the magnitude of the voltage $U_{comp}$.

Figure 6:
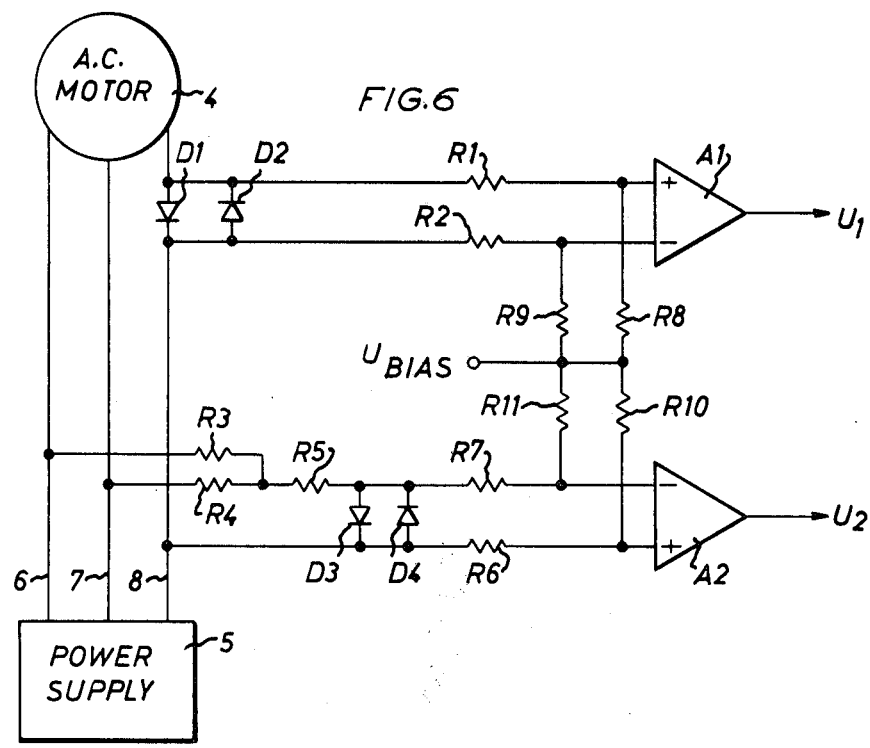
FIG. 6 is a circuit diagram of a circuit for providing the input voltages to the phase comparator in the apparatus according to the present invention.

FIG. 6 shows a circuit for producing the input voltages of the phase comparator 1 in FIG. 4. An AC motor 4 is connected to a three-phase current source 5, for instance the mains, via supply leads 6, 7 and 8. In the phase conductor 8 two diodes D1 and D2 are series connected in an antiparallel manner. Further, the diodes D1 and D2 are connected via resistors R1 and R2 to the inputs of a first differential amplifier A1 in the manner illustrated. Three resistors R3, R4 and R5 are connected in star-connection to the three supply leads 6, 7 and 8, respectively, two diodes D3 and D4 being connected in series with the resistor R5 in an antiparallel manner. Via two resistors R6 and R7 on the one hand the phase conductor 8 and on the other hand the junction between the diodes D3, D4 and the resistor R5 are connected to the inputs of a second differential amplifier A2 in the manner illustrated. Further, each of the inputs of the differential amplifiers A1 and A2 has a bias $U_{bias}$ impressed upon it via a resistor R8, R9, R10 and R12.

The function of the circuits in FIG. 6 is as follows. The diodes D1 and D2 deliver an input signal to the differential amplifier A1, which input signal has a fixed phase position relative to the current flowing through the phase conductor 8. Similarly, the differential amplifier A2 is supplied with an input signal of fixed phase position relative to the voltage impressed upon the load 4 via the supply lead 8. The resistors R3-R5 produce a reference potential for this voltage. The differential amplifiers A1 and A2 are operational amplifiers acting as comparators, for which reason their output signals $U_1$ and $U_2$, respectively, are square wave voltages of phases corresponding to the phases of the input signals.

Figure 7:
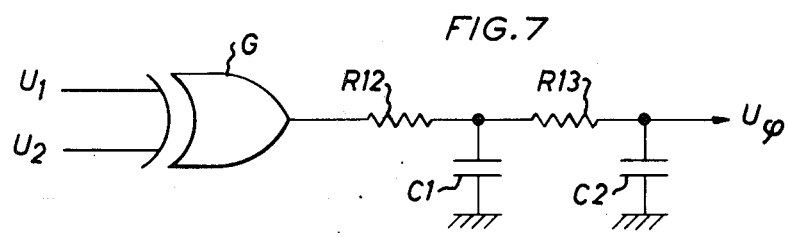
FIG. 7 is a circuit diagram of a phase comparator according to the invention.

The phase comparator illustrated in FIG. 7 includes an EXCLUSIVE-OR gate G which as input signals receives the voltages $U_1$ and $U_2$. The output of the gate G is connected to a low-pass filter formed by two RC links having resistors R12, R13 and capacitors C1, C2. It will be realized that the output signal of the gate G is zero if the phase shift between the input signals $U_1$ and $U_2$ is zero degrees, and a constant direct voltage of predetermined value if the phase shift between said input signals amounts to 180°. For phase shifts between these values the output signal of the gate G further is a pulse train of the double frequency of the input signals and of a pulse width directly proportional to the phase difference. The mean value of the output signal of the gate G is formed by means of the low-pass filter, i.e. the output voltage of said filter is a direct voltage of a magnitude proportional to said phase difference.

Figure 8:
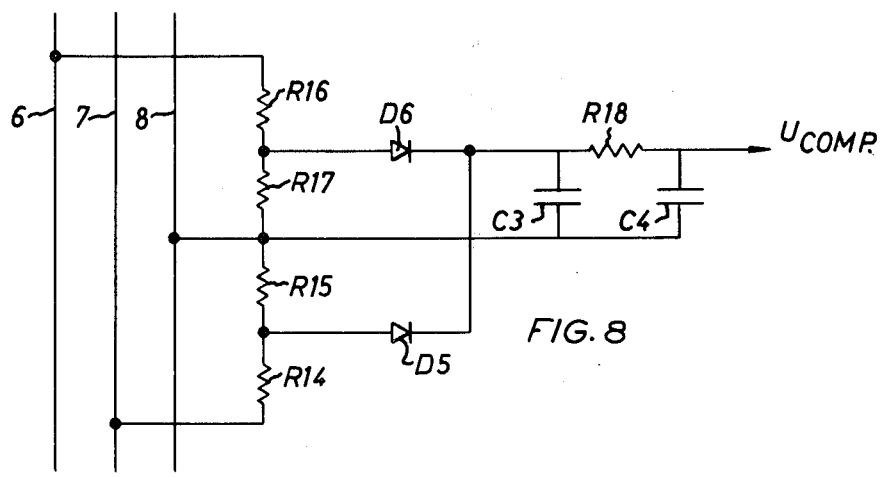
FIG. 8 is a circuit diagram of the rectifying circuit of the present invention.

The rectifier circuit 2 according to the present invention illustrated in FIG. 8 includes a first voltage divider connected between the supply leads 7 and 8 and having two resistors R14 and R15, and a second voltage divider connected between the supply leads 6 and 8 and having two resistors R16 and R17. A diode D5 is connected between the junction of the resistors R14, R15 and a low-pass filter formed by two capacitors C3, C4 and a resistor R18. A diode D6 is similarly connected between the junction of the resistors R16, R17 and said low-pass filter. It will be realized that a direct voltage $U_{comp}$ is obtained at the output of the filter, the magnitude of said direct voltage being proportional to the amplitude of the voltages between the supply lead 8 and the supply leads 6 and 7.

The combination circuit according to the present invention illustrated in FIG. 9 includes a resistor R19 and a resistor R20 by means of which the output voltage $U_\phi$ of the phase comparator 1 and the output voltage $U_{comp}$ of the rectifier circuit 2 are added to form the corrected output signal $U_{\phi corr}$. For detecting when the loading passes a certain value and as a consequence when the voltage $U_{\phi corr}$ passes a certain magnitude, a reference voltage $U_{ref}$ having said magnitude can be impressed upon the inverting input of a differential amplifier A3 which functions as a comparator, the voltage $U_{\phi corr}$ being impressed upon the non-inverting input of said differential amplifier A3. When the magnitude of the voltage $U_{\phi corr}$ exceeds the magnitude of the reference voltage $U_{ref}$ the voltage of the output of the amplifier A3 will thus change from negative to positive polarity. The resistor R21 gives a certain hysteresis. The circuit in FIG. 9 can thus be exploited for detecting that the loading reaches for instance some predetermined maximum value. The corresponding circuits for detecting that the loading reaches some predetermined minimum value can readily be embodied by one skilled in this art.

FIG. 10 illustrates an alternative embodiment of the combination circuit 3. The phase comparator gate G illustrated in FIG. 7 is connected not to a low-pass filter but to an operational amplifier A4 coupled as an integrator, on the one hand via a resistor R22 and on the other hand via an inverter I in series with a resistor R23. To provide the integrating function a capacitor C5 is connected between the output of the amplifier A4 and the inverting input thereof. The output is connected via a resistor R24 to the non-inverting input of a differential amplifier A5 functioning as a comparator, and to said non-inverting input of the differential amplifier A5 there is connected also the output of the rectifier circuit according to FIG. 8 via a resistor R25. A source (not shown) of a reference voltage $U1_{ref}$ is connected to the inverting input of the amplifier A5. The output of the amplifier A5 is connected via a resistor R26 to an opto-coupler O and a low-pass filter having resistors R27, R28 and capacitors C6, C7 is connected to the output of said opto-coupler.

The function of the circuit in FIG. 10 will now be explained with reference to FIG. 11 where wave forms $a$-$d$ designate signals at points in FIG. 10 indicated by corresponding letters. The output signal $a$ of gate G and its complementary signal $b$ are integrated by the integrator A4 which by suitable choice of the values for the capacitor C5 and the resistors R22, R23 gives an output voltage of trapezoidal wave form $c$. The sum of said voltage and the direct voltage $U_{comp}$ is impressed upon one input of the amplifier A5 for comparison with the reference voltage $U1_{ref}$, whereby the binary signal of wave form $d$ is obtained. Said signal is passed via the opto-coupler O to the low-pass filter R27, R28, C6, C7 whose output signal is $U_{\phi corr}$. It will be recalled that the output signal of the gate G is a pulse train of pulses whose width is proportional to the phase difference between the input voltages U1 and U2. As will appear from FIG. 11 the signal at the output of the amplifier A5 can be caused to show pulses having a pulse width proportional to that of the pulses in the signal at the output of the gate G. A change of the supply voltage will give rise to a change of the pulse width but this change will be compensated for by the direct voltage level of the wave form $c$ being changed by means of the voltage $U_{comp}$. To attain this the slope of the edges of the wave form $c$ will, as one skilled in the art will realize, be suitably determined in dependence on the variation of the voltage $U_{comp}$ as well as the pulse width variation in the wave form $a$ with supply voltage variations.

The circuit formed by the inverter I, the amplifiers A4, A5 and the associated capacitors and resistors thus is a kind of pulse width modulator for modulating the pulse width of the pulses in the pulse train from the phase comparator 1 by means of the direct voltage from the rectifier circuit 2.

The circuit according to FIG. 10 has the substantial advantage that galvanic insulation is obtained between the supply leads 6, 7 and 8 and the circuits (not shown) exploiting the signal $U_{\phi corr}$.

It shall finally be mentioned that the amplifiers A1, A2, A3, A4 and A5 can be operational amplifiers of the type LM 3900 which is a single supply operational amplifier.

What I claim and desire to secure by Letters Patent is:

1. An apparatus for producing a signal indicating the loading of an electric AC motor, especially an asynchronous motor, comprising circuit means for producing a first alternating voltage signal of fixed phase position relative to the motor current and a second alternating voltage signal of fixed phase position relative to the motor voltage; phase detector means coupled to said circuit means for generating a train of pulses of a width proportional to the phase difference between the first and second alternating voltage signals; rectifier means for generating a direct voltage signal of a magnitude proportional to the amplitude of the motor voltage; and means connected to said phase detector means and said rectifier means for generating the load indicating signal; said means connected to said phase detector means and said rectifier means including pulse width modulating means for modulating the pulse width of the pulses in the pulse train from said phase detector means by means of the direct voltage signal from said rectifier means, and a low-pass filter receiving the output signal of said pulse width modulating means for generating the load indicating signal; said pulse width modulating means including a circuit integrating the output signal of said phase detector means and the complementary signal thereof for generating a trapezoidal wave form signal, an adding circuit for adding the trapezoidal wave form signal and the direct voltage signal of said rectifier means, and a comparator for comparing the output signal of said adding circuit with a reference signal and generating a binary signal for supplying said low-pass filter.

* * * * *